United States Patent [19]

Anderson et al.

[11] 4,375,390

[45] Mar. 1, 1983

[54] THIN FILM TECHNIQUES FOR FABRICATING NARROW TRACK FERRITE HEADS

[76] Inventors: Nathaniel C. Anderson, P.O. Box 157 (Section 11, New Haven Township), Pine Island, Minn. 55963; Larry E. Daby, 3314 Vist View Ct., SW., Rochester, Minn. 55901; Vincent D. Gravdahl, 1811 Cascade St., NW., Rochester, Minn. 55901; Patrick M. McCaffrey, 1914 W. Center St., Rochester, Minn. 55901; Bruce A. Murray, 3135 Crescent La., Rochester, Minn. 55901; Bruce W. Wright, Rte. 1, Box 26, Oronoco, Minn. 55960

[21] Appl. No.: 357,947

[22] Filed: Mar. 15, 1982

[51] Int. Cl.$^3$ ............................................. C23C 15/00
[52] U.S. Cl. ................................. 204/15; 204/192 E; 156/643
[58] Field of Search ............... 204/15, 192 E; 156/643

[56] References Cited

U.S. PATENT DOCUMENTS

| | | | |
|---|---|---|---|
| 3,808,108 | 4/1974 | Herb et al. | 204/15 |
| 3,984,300 | 10/1976 | Vanommeren | 204/192 E |
| 4,124,473 | 11/1978 | Lehmann | 204/192 E |
| 4,256,514 | 3/1981 | Pogge | 156/643 |
| 4,259,433 | 3/1981 | Mizobuchi | 156/643 |
| 4,275,286 | 6/1981 | Hackett | 156/643 |

OTHER PUBLICATIONS

IBM Technical Bulletin Vol. 24, No. 2 July 1981, page 995, "Fabrication of Ferrite Magnetic Head"

*Primary Examiner*—Arthur P. Demers

[57] ABSTRACT

A process for producing a reactive ion-etched structure with height and width dimensions of the order of 25 microns or less on a ferrite substrate surface is disclosed. A mask of positive water saturated photoresist is formed on the substrate. A metal taken from the group consisting of nickel and a nickel-iron alloy is plated through the mask. The photoresist mask is removed to leave a pattern in the plated metal. The ferrite substrate surface that is exposed by the pattern is reactive ion etched with a power density of $>1 w/cm^2$ and a bias voltage $< -100$ volts.

10 Claims, 8 Drawing Figures

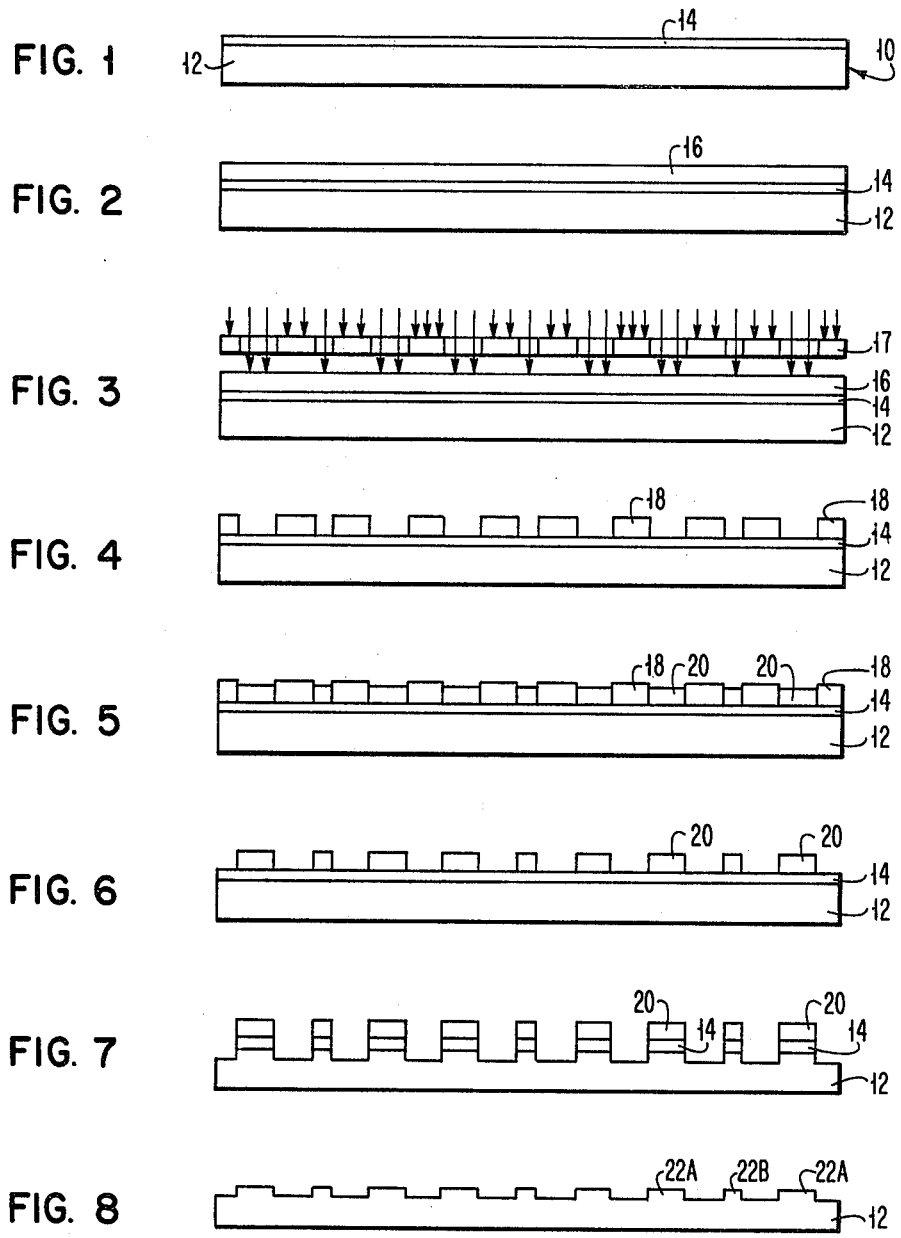

THIN FILM TECHNIQUES FOR FABRICATING NARROW TRACK FERRITE HEADS

DESCRIPTION

Technical Field

This invention relates to ferrite magnetic heads and more particularly to a method of forming minute structures on a ferrite substrate surface.

Background Art

Narrow tracks in a ferrite substrate found in magnetic head slider assemblies have been fabricated by well known conventional methods. One such method is by machining which is suitable for use as long as the track widths and heights are greater than 1 mil or 25 microns. Dimensions below 25 microns are difficult to machine.

Another method for fabricating ferrite magnetic heads is the reactive-ion etching method described in the IBM Technical Disclosure Bulletin Vol. 24 No. 2, July 1981, page 995. This process uses a photoresist mask. The photoresist mask layer is thick because the photoresist etches four to six times faster than the ferrite material. With an etching or aspect ratio of this size, it is necessary to have a photoresist layer with a thickness of between 64 and 96 microns in order to obtain an etch depth of 16 microns in a ferrite substrate. Such a thick photoresist mask compared to a track width of about 16 microns causes the photoresist to be unstable both mechanically and thermally. As a result this method does not provide adequate width control.

SUMMARY OF THE INVENTION

It is primary object of this invention to provide a process for producing a ferrite structure having height and width dimensions of the order of 25 microns or less.

It is another object of this invention to provide a reactive-ion etching method for producing ferrite structures having height and width dimensions of the order of 25 microns or less.

These and other objects are accomplished by a process for producing a reactive-ion etch structure with height and width dimensions of the order of 25 microns or less on a ferrite substrate surface. Initially, an electrically conductive layer is deposited on the substrate surface. A preferred example would be a layer of nickel-iron alloy. The next step is to form a mask of a positive water saturated photoresist on the conductive layer. The area of the conductive layer exposed by the positive photoresist mask is then plated with one of the group consisting of nickel and a nickel-iron alloy. The photoresist mask is then removed leaving a pattern of the plated metal. The ferrite substrate surface is then reactive-ion etched by exposure with a power density of $>1$ w/cm$^2$ and a bias voltage $<-100$ volts. The metal pattern is then removed leaving an etch structure.

Other objects of this invention will be apparent from the following detailed description, reference being made to the accompanying drawing.

BRIEF DESCRIPTION OF THE DRAWINGS

FIGS. 1 through 8 are cross-sectional views of the ferrite structure illustrating the various stages in the process of this invention.

DESCRIPTION OF THE PREFERRED EMBODIMENT

This fabrication process involves a series of steps which are necessary to provide track widths and heights less than 25 microns in size in a ferrite substrate.

As shown in FIG. 1, a structure 10 has a ferrite substrate 12. Examples of the ferrite substrate material are nickel-zinc ferrite and manganese-zinc ferrite. The substrate 12 is cleaned by conventional methods such as rinsing in suitable solvents such as acetone and isopropyl alcohol. A layer 14 of a conductive material such as permalloy metal, a nickel (80%)-iron (20%) alloy, is deposited on the surface of the ferrite substrate 12. The thickness of the conductive layer 14 is of the order of 1000 A° and may be deposited by sputtering or evaporation. The purpose of layer 14 is to provide a seed layer for the subsequent electrodeposition of a thicker metal mask layer.

On top of the conductive layer 14 is a thick layer of positive photoresist 16. A positive resist becomes more soluble upon exposure to actinic radiation. The positive photoresist 16 may be any of the positive photoresists well known in the art. An example is AZ-119, a positive photoresist sold by Shipley which contains a novolac resin, photoactive Diazo compound cellosolve acetate, toluene, O-chlorotoluene butyl acetate and xylene.

As is practiced in the art, a layer of positive photoresist is subjected to a pre-bake step to remove excess solvent. Particularly, the pre-bake step is done at a temperature of the order of 78° C. for a time period of about 30 minutes.

The layer of resist 16 has a thickness which is several microns thicker than a metal mask which will be hereinafter more fully described. An example of the thickness of the photoresist layer is 12 microns. The photoresist layer having such thickness was formed by applying three coats, where each coat is followed by a pre-bake step of 1 minute at 78° C.

After the photoresist layer 16 has the required thickness and the 30 minute pre-bake step, the structure is placed in a high humidity chamber in order to saturate the photoresist layer 16 with water. Saturating the photoresist layer 16 with water substantially eliminates the cross-linking that occurs in photoresist when the photoresist is subjected to high exposure dosages of the order of 1600 to 1700 mJ/cm$^2$.

Cross-linking in photoresists having a low water content results in a film of residue on the seed layer 14 that does not come off after the photoresist is developed. This residue film which isn't removed causes the subsequent metal layer to either be plated unevenly or not plated at all. The metal that is plated adheres poorly. As a result, it is important that the photoresist layer be saturated with water so that the undesirable insoluble residue is not formed.

After the water has been added to the photoresist layer 16, it is then exposed to actinic radiation through a mask 17 to provide an exposure dosage of the order of 1680 mJ/cm$^2$, for example, 80 seconds at 21 mW/cm$^2$, as shown in FIG. 3. The exposed photoresist is then developed to yield the structure shown in FIG. 4 in which a photoresist mask 18 is positioned on the seed layer 14.

As shown in FIG. 5, a masking layer 20 is deposited, preferably by plating, in the openings of the photoresist mask 18 onto the seed layer 14. The masking layer is a metal taken from the group consisting of nickel and nickel-iron alloys. Nickel is a preferred mask material. Other metals such as copper, iron and alloys thereof may also be used under certain etching conditions.

In plating layers of nickel and nickel-iron alloys that are thicker than 5μ, for example, 10μ, it is preferred to use a plating solution with a pH of about 3.5 to 4.5. While conventional nickel plating baths that are used in plating thin nickel layers, i.e. >5μ, have a pH of 2.5 to 3.0, it has been found that the thickness uniformity and deposition rate of thick nickel layers is marginal with the lower pH for magnetic head slider assembly dimensional requirements.

As shown in FIG. 6 the photoresist mask 18 is removed to leave a metal mask 20. The thickness of the metal mask 20 is of the order of about 10 microns. The thickness is determined by the depth that is to be etched in the ferrite structure. With a preferred mask there is a greater than 1.5 to 1 etch ratio of the ferrite to mask material. As an example, in etching a depth of 16 microns of ferrite material, the mask would need to be about 8 microns, that is one-half of the 16 microns, plus two additional microns to allow for process tolerances for a total thickness of 10 microns.

As shown in FIG. 7, the structure is exposed to a reactive ion process. The parts are placed directly on the cathode of a RF sputtering etching system. Typically, the cathode is water-cooled. When the part is placed in thermal contact with the cathode, its temperature is on the order of 50° C. The etch rate is then relatively slow, that is, the ferrite is etched at the rate of 300 to 400 A° per minute.

Increasing the temperature of the part to be etched enhances a reactive component of the reactive ion etching process thereby increasing the rate of removal of the ferrite. The temperature of the part can be increased by thermally separating the part from the water cooled cathode. An example, would be setting the parts on narrow standoffs such as knife edges. Hot substrates having temperatures of the order of 300° C. have etch rates at least three times greater than cooled substrates having temperatures of the order of 50° C. under the same operating conditions. Etching with the substrate at a higher temperature also results in a coating which forms on the nickel mask which inhibits the nickel mask from etching as fast as it would without the coating thereon. The coating, which consists mostly of carbon, is believed to be at least partially due to the catalytic breakdown of the etching gas. The end result of etching at an elevated temperature is to increase the etch rate ratio between the ferrite and the nickel mask. For example, the etch rate ratio of the ferrite/nickel mask is of the order of 1.5 when the workpiece temperature is 50°, whereas the etch ratio can be approximately 2.4 or greater when the workpiece temperature is of the order of 250 to 300° C.

Reactive ion etching is done with a power of the order of 1700 to 3000 watts to produce a power density of between 1.7 to 3.0 watts/cm$^2$. A bias voltage greater than −100 volts and preferably between −1400 and −1900 volts is used. The relatively high wattage is required in order to obtain a ferrite etch rate of the order of 350 A° per minute. An etch rate of 350 A° per minute or higher is desirable in order to etch parts in a 7 or 8 hour cycle time or less. In accordance with this invention, ferrite etch rates as high as 3100 A° per minute have been obtained. The bias voltage needs to be more negative than −100 volts in order to prevent a polymer from depositing on the ferrite during the reactive ion etching step.

The pressure of the gas mixture in the system varies from 2 microns up to the order of 25 microns. The fastest etch rate was obtained when the pressure was 20 microns. Suitable gases for etching are $CCl_4$, $CCL_2F_2$ and other halogenated hydrocarbons by themselves or with diluents such as $N_2$ or forming gas or Argon.

When the etching step is completed, the metal mask 20 and the seed layer 14 are removed with an etchant that removes the mask without significantly damaging the ferrite substrate 12. Examples of such etchants are ferric chloride, ammonium persulfate and an acetone nitric acid mixture. The resultant structure as shown in FIG. 8 has a substrate 12 and tracks 22A and B thereon. The width of the track 22B is of the same order as the depth of the track 22B, for example, about 16 microns. The width of tracks 22A as shown in FIG. 8 is larger.

EXAMPLE NO. 1

A nickel-zinc ferrite substrate was cleaned with acetone and isopropyl alcohol. A layer 1000 A° thick of permalloy was sputtered onto the cleaned surface of the substrate. A layer of positive photoresist AZ119 which was 4 microns thick was deposited on top of the permalloy layer. The photoresist layer was pre-baked at 78° for 1 minute. Two other layers of the same photoresist were deposited thereon. The second layer was also baked 1 minute at 78° C. and the last layer baked for 30 minutes at 78° C. to provide a layer 12 microns thick. The photoresist layer was then saturated with water by placing in a high humidity chamber for 60 minutes. A pattern was then placed over the photoresist, subjected to an actinic radiation dosage of 1600 milijoules/cm$^2$ and developed. A nickel layer was then plated in the photoresist openings until the nickel layer had a thickness of 10 microns. The photoresist mask was then removed. The workpiece was then placed on the cathode of a standard RF sputter etching system and the seed layer was removed. The workpiece was then placed on the cathode of a standard RF sputter system and was spaced away from the cathode so that it was not cooled by the cathode. The temperature of the workpiece was between 250° and 300° C. A power of 2100 watts and a bias voltage of −1525 volts were used in the system to provide a power density of 2.1 watts/cm$^2$. Carbon tetrachloride was introduced into the chamber to provide a pressure of 20 microns. The power was applied for a period of 60 minutes to etch a depth of 18.6 microns in the ferrite. This provided an etch rate of 3100 A° per minute of the ferrite and 1190 A° per minute of the nickel mask. The resultant etch ratio of the ferrite to nickel mask was 2.6. The width of the track pattern was of the order of 17 microns. The resultant narrow track, which was 17 microns in width and 18.6 microns in height was suitable for use in the magnetic head assembly.

The following table summarizes the data for examples 2 through 7 as well as Example No. 1.

| Example | Workpiece Temperature 50° C. | Workpiece Temperature 250–300° C. | Etch Time, Minutes | Power Watts | Power Density, Watts/cm² | Bias Voltage | Reactive Gas Mixture | Total Pressure, μ | Ferrite Etch Depth μ | Etch Rate, Å/min Ferrite | A°/min Mask | Etch Ratio Ferrite/Mask | Mask |
|---|---|---|---|---|---|---|---|---|---|---|---|---|---|
| 1 |   | X | 60 | 2100 | 2.1 | 1525 | CCl₄ | 20 | 18.6 | 3100 | 1190 | 2.6 | Ni |
| 2 |   | X | 201 | 1700 | 1.7 | 1475 | CCl₂F₂, N₂(3% H) | 19.97 | 15.5 | 770 | 323 | 2.4 | Ni |
|   |   |   |   |   |   |   |   |   | 14.1 | 700 | 427 | 1.6 | Ni(80%) Fe(20%) |
|   |   |   |   |   |   |   |   |   | 14.6 | 726 | 497 | 1.4 | Ni(80%) Fe(20%) |
| 3 |   | X | 201 | 1750 | 1.7 | 1475 | CCl₂F₂, N₂(3% H₂) | 20.3 | 16.1 | 800 | 398 | 2.0 | Ni |
|   |   |   |   |   |   |   |   |   | 4 | 800(est) | 1720(est) | 0.46 | Cu |
| 4 |   | X | 230 | 2500 | 2.5 | 1694 | CCl₂F₂, N₂ | 2.99 | 16.1 | 700 | 361 | 1.9 | Ni |
| 5 |   | X | 152.5 | 2500 | 2.5 | 1600 | CCl₂F₂, N₂ | 3.08 | 10.06 | 660 | 420 | 1.6 | Ni |
| 6 | X |   | 270 | 2300 | 2.3 | 1900 | CCl₂F₂, N₂(3% H₂) | 2 | 11.45 | 420 | 180 | 1.5 | Ni |
| 7 | X |   | 60 | 2400 | 2.4 | 1900 | CCl₂F₂, N₂(3% H₂) | 2.5 | 1.8 | 300 | 200 | 1.5 | Ni |

Although a preferred embodiment of this invention has been described, it is understood that numerous variations may be made in accordance with the principles of this invention.

We claim:

1. A process for producing a reactive ion etched structure with height and width dimensions of the order of 25 microns or less on a ferrite substrate surface comprising the steps of
    depositing an electrically conductive layer on the substrate surface,
    forming a mask of positive photoresist on said conductive layer,
    plating said conductive layer exposed by said mask with one of the group consisting of nickel and nickel-iron alloys,
    removing said photoresist mask to leave a pattern of said plated metal,
    reactive-ion etching the ferrite substrate surface that is exposed by said pattern with a power of >1 watts/cm² of cathode area and a bias voltage <−100 volts, and
    removing said metal pattern to leave said etched structure.

2. A process as described in claim 1 whereby the ferrite substrate surface exposed by said pattern is reactive-ion etched with a power density of 1.7 to 3.0 watts/cm².

3. A process as described in claim 1 whereby the ferrite substrate surface exposed by said pattern is reactive-ion etched with a bias voltage of −1400 to −1900 volts.

4. A process as described in claim 1 whereby the mask is at least two microns thicker than said pattern thickness.

5. A process as described in claim 1 whereby after a prebake step, said mask is exposed to a high humidity in order to increase the H₂O content of said mask.

6. A process as described in claim 1 wherein the plating layer is at least the desired substrate etch depth divided by the etch ratio plus about 2 micronmeters.

7. A process as described in claim 1 whereby the substrate is at a temperature of 250° C. to 300° C. during the reactive ion etch step.

8. A process as described in claim 1 whereby the reactive gas includes a halogenated hydrocarbon.

9. A process as described in claim 1 whereby nickel is plated on said conductive layer.

10. A process as described in claim 1 whereby the pH of the electroplating bath is 3.5 to 4.5.

* * * * *

UNITED STATES PATENT AND TRADEMARK OFFICE
CERTIFICATE OF CORRECTION

PATENT NO. : 4,375,390
DATED : March 1, 1983
INVENTOR(S) : N.C. Anderson, L.E. Daby, V.D. Gravdahl, P.M. McCaffrey, B.A. Murray and B.W. Wright It is certified that error appears in the above—identified patent and that said Letters Patent is hereby corrected as shown below:

On the title page add

--[73] Assignee: International Business Machines Corporation, Armonk, N.Y.--

Signed and Sealed this

Thirty-first Day of May 1983

[SEAL]

Attest:

DONALD J. QUIGG

*Attesting Officer*  *Acting Commissioner of Patents and Trademarks*